(12) United States Patent
Wang et al.

(10) Patent No.: US 10,931,436 B1
(45) Date of Patent: Feb. 23, 2021

(54) DETECTOR CIRCUIT AND OPERATION METHOD

(71) Applicant: Realtek Semiconductor Corporation, Hsinchu (TW)

(72) Inventors: Shun-Sheng Wang, Kaohsiung (TW); Ta-Chin Tseng, New Taipei (TW); Tseng-Kuei Lin, Zhubei (TW); Zong-Cheng Wu, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/785,782

(22) Filed: Feb. 10, 2020

(30) Foreign Application Priority Data

Aug. 15, 2019 (TW) .................................. 10812915.9

(51) Int. Cl.
*H04L 7/04* (2006.01)
*H03K 5/15* (2006.01)
*H03K 5/00* (2006.01)

(52) U.S. Cl.
CPC .......... *H04L 7/042* (2013.01); *H03K 5/15073* (2013.01); *H03K 2005/00156* (2013.01)

(58) Field of Classification Search
CPC ................................ H04L 7/042; H04L 7/043
See application file for complete search history.

(56) References Cited

U.S. PATENT DOCUMENTS

| | | | |
|---|---|---|---|
| 6,714,586 B2 | 3/2004 | Yang et al. | |
| 6,785,321 B1 | 8/2004 | Yang et al. | |
| 7,869,489 B2 * | 1/2011 | Jang | H04B 1/70752 375/150 |
| 7,924,952 B2 * | 4/2011 | Suzuki | H04L 7/042 375/343 |
| 2003/0026219 A1 | 2/2003 | Moon et al. | |
| 2005/0286661 A1 | 12/2005 | Kwak | |
| 2016/0365967 A1 | 12/2016 | Tu et al. | |

FOREIGN PATENT DOCUMENTS

| | | |
|---|---|---|
| CN | 1398460 A | 2/2003 |
| EP | 1071966 B1 | 5/2012 |

OTHER PUBLICATIONS

Peiqing Wang et al., "1000BASE-T1 PHY Synchronization Method & Start-up Process and Link Failure Case Analysis", IEEE 802.3bp Task Force, Jul. 15, 2014.

* cited by examiner

*Primary Examiner* — Patrick O Neill
(74) *Attorney, Agent, or Firm* — Locke Lord LLP; Tim Tingkang Xia, Esq.

(57) ABSTRACT

A detector circuit incudes a calculator circuit and a comparator circuit. The calculator circuit is configured to generate a plurality of first calculation values according to a plurality of first calculation symbols of a Pseudo-Noise Sequence and a plurality of second calculation symbols of a received signal, and generate a second calculation value according to the first calculation values. If a sign of a symbol of the Pseudo-Noise Sequence is the same to a sign of an adjacent symbol, the symbol is one of the first calculation symbols, and the second calculation symbols are corresponding to the first calculation symbols respectively. The comparator circuit is configured to generate a comparison result according to the second calculation value and a threshold value. The comparison result is configured for determining whether the detector circuit correctly receives the Pseudo-Noise Sequence.

20 Claims, 5 Drawing Sheets

DETECTOR CIRCUIT AND OPERATION METHOD

RELATED APPLICATIONS

This application claims priority to Taiwanese Application Serial Number 108129159, filed Aug. 15, 2019, which is herein incorporated by reference.

BACKGROUND

Technical Field

The present disclosure relates to a circuit technology. More particularly, the present disclosure relates to a detector circuit and operation method.

Description of Related Art

In communication technology, a synchronization procedure is executed before a transmitter device transmits signals to a receiver device. In general, a Pseudo-Noise Sequence (PN Sequence) is utilized to execute the synchronization procedure.

SUMMARY

One embodiment of the present disclosure is related to a detector circuit. The detector circuit incudes a calculator circuit and a comparator circuit. The calculator circuit is configured to generate a plurality of first calculation values according to a plurality of first calculation symbols of a Pseudo-Noise Sequence and a plurality of second calculation symbols of a received signal, and generate a second calculation value according to the first calculation values. If a sign of a symbol of the Pseudo-Noise Sequence is the same to a sign of an adjacent symbol, the symbol is one of the first calculation symbols. The second calculation symbols are corresponding to the first calculation symbols respectively. The comparator circuit is configured to generate a comparison result according to the second calculation value and a threshold value. The comparison result is configured for determining whether the detector circuit correctly receives the Pseudo-Noise Sequence.

One embodiment of the present disclosure is related to a detector circuit. The detector circuit incudes a sign detector circuit, a calculator circuit and a comparator circuit. The sign detector circuit is configured to generate a received signal according to a received Pseudo-Noise Sequence corresponding to a Pseudo-Noise Sequence. The calculator circuit is configured to generate a plurality of first calculation values according to a plurality of first calculation symbols of the Pseudo-Noise Sequence and a plurality of second calculation symbols of the received signal, and generate a second calculation value according to the first calculation values. The second calculation symbols are corresponding to the first calculation symbols respectively. The comparator circuit is configured to generate a comparison result according to the second calculation value and a threshold value. The comparison result is configured for determining whether the detector circuit correctly receives the Pseudo-Noise Sequence.

One embodiment of the present disclosure is related to an operation method of a detector circuit. The operation method includes: generating, by a sign detector circuit, a received signal according to a received Pseudo-Noise Sequence corresponding to a Pseudo-Noise Sequence; generating, by a calculator circuit, a plurality of first calculation values according to a plurality of first calculation symbols of the Pseudo-Noise Sequence and a plurality of second calculation symbols of the received signal, and generating a second calculation value according to the first calculation values, in which if a sign of a symbol of the Pseudo-Noise Sequence is the same to a sign of an adjacent symbol, the symbol is one of the first calculation symbols, in which the second calculation symbols are corresponding to the first calculation symbols respectively; and generating, by a comparator circuit, a comparison result according to the second calculation value and a threshold value, in which the comparison result is configured for determining whether the detector circuit correctly receives the Pseudo-Noise Sequence.

As shown in the above embodiments, the detector circuit of the present disclosure can decrease circuit complexity and calculation complexity.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
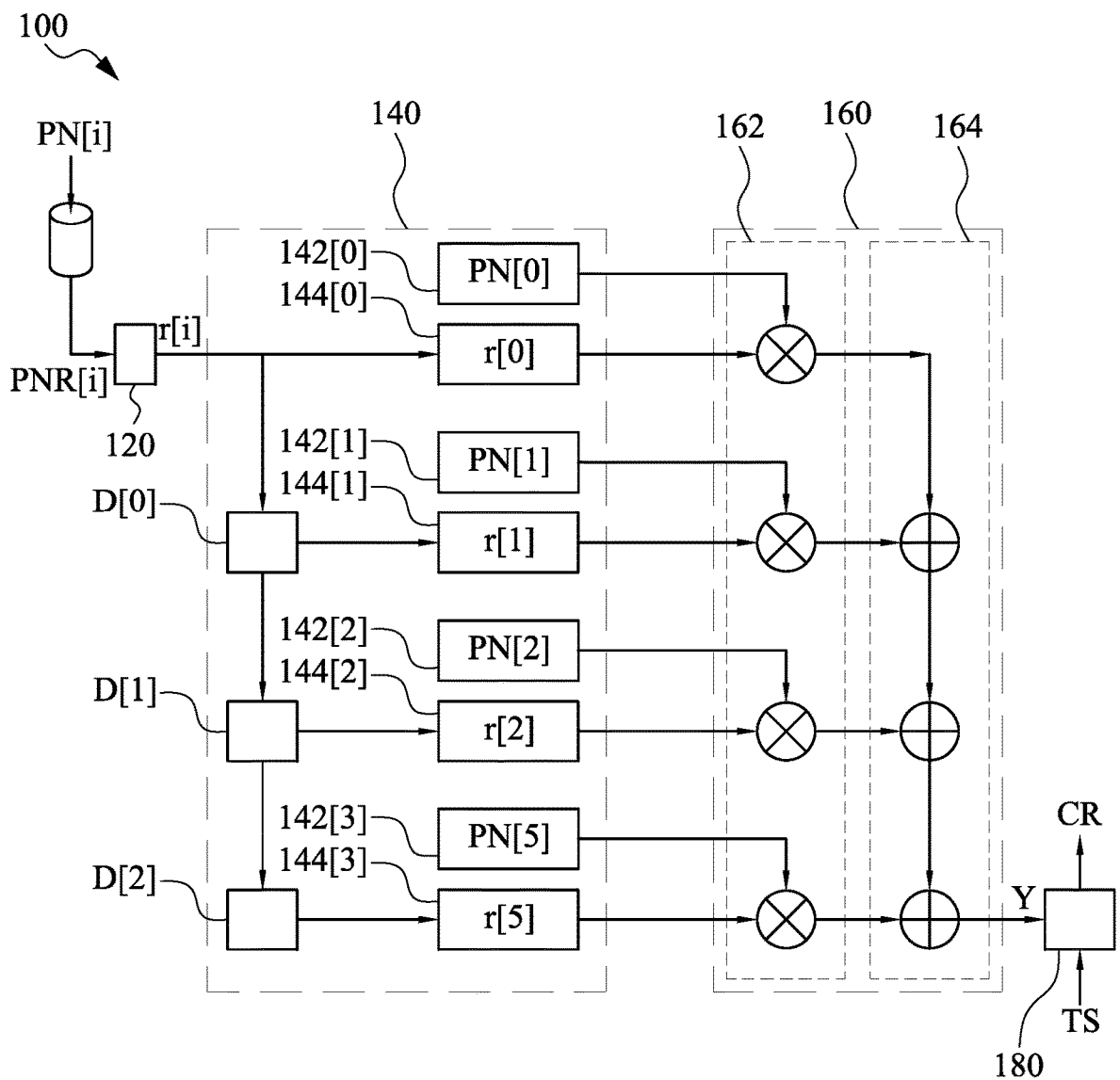
FIG. 1 is a circuit diagram illustrating a detector circuit according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may be referred to "electrically connected" or "electrically coupled." "Connected" or "coupled" may also be referred to operations or actions between two or more elements.

Reference is made to FIG. 1. FIG. 1 is a circuit diagram illustrating a detector circuit 100 according to some embodiments of the present disclosure. In some embodiments, the detector circuit 100 is disposed in a receiver device. The receiver device receives a Pseudo-Noise Sequence (PN Sequence) from a transmitter device. The Pseudo-Noise Sequence is a sequence composed of "+1" and "−1". The detector circuit 100 of the receiver device determines whether the receiver device correctly receives the Pseudo-Noise Sequence according to a received signal corresponding to the Pseudo-Noise Sequence, to determine whether a synchronization procedure between the receiver device and the transmitter device is completed. When the synchronization procedure is completed, the transmitter device can transmit signals to the receiver device, and the receiver device can also transmit signals to the transmitter device.

As illustrated in FIG. 1, the detector circuit 100 includes a sign detector circuit 120, a storage circuit 140, a calculator circuit 160, and a comparator circuit 180. The storage circuit 140 is coupled to the sign detector circuit 120. The calculator circuit 160 is coupled to the storage circuit 140. The comparator circuit 180 is coupled to the calculator circuit 160. The detector circuit 100 is configured to receive a Pseudo-Noise Sequence (for example, a Pseudo-Noise Sequence PN[i] in FIG. 2) from a transmitter device.

Figure 2:
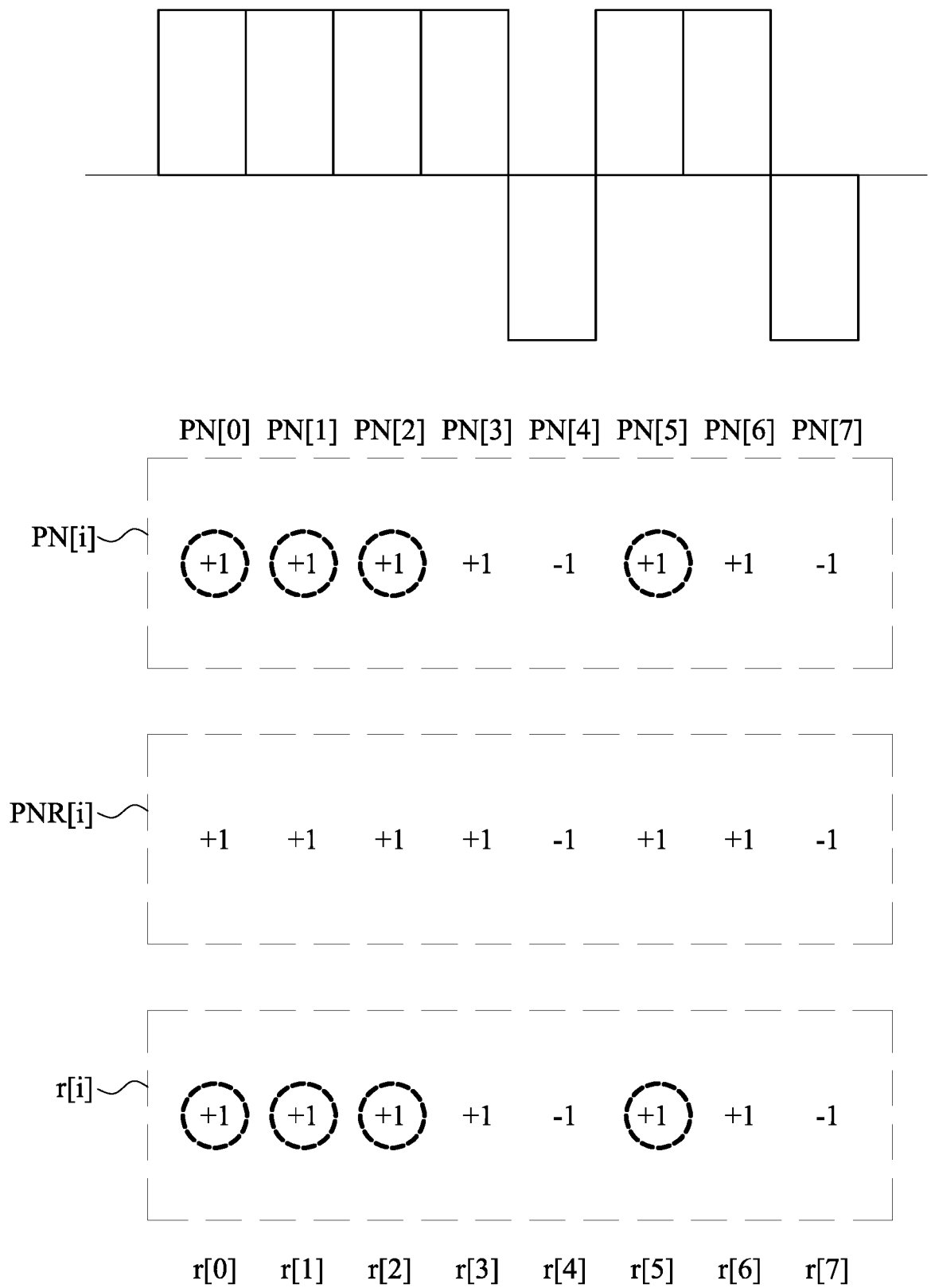
FIG. 2 is a schematic diagram illustrating a Pseudo-Noise Sequence, a received Pseudo-Noise Sequence, and a received signal according to some embodiments of the present disclosure.

Reference is made to FIG. 1 and FIG. 2. FIG. 2 is a schematic diagram illustrating the Pseudo-Noise Sequence PN[i], a received Pseudo-Noise Sequence PNR[i], and a received signal r[i] according to some embodiments of the present disclosure. As illustrated in FIG. 2, the Pseudo-Noise Sequence PN[i] from the transmitter device includes eight symbols. A symbol PN[0] is "+1", a symbol PN[1] is "+1", a symbol PN[2] is "+1", a symbol PN[3] is "+1", a symbol PN[1] is "−1", a symbol PN[5] is "+1", a symbol PN[6] is "+1", and a symbol PN[7] is "−1". In some other embodiments, the Pseudo-Noise Sequence PN[i] may include more symbols (for example, 255 symbols).

The Pseudo-Noise Sequence PN[i] from the transmitter is transmitted through a transmission channel to generate the received Pseudo-Noise Sequence PNR[i]. The received Pseudo-Noise Sequence PNR[i] is received by the sign detector circuit 120 of the detector circuit 100. The received Pseudo-Noise Sequence PNR[i] is converted by the sign detector circuit 120 to generate the received signal r[i]. In some embodiments, the sign detector circuit 120 may be implemented by a sign function circuit. When an (n)th symbol of the received Pseudo-Noise Sequence PNR[i] is equal to or greater than "0", an (n)th symbol of the received signal r[i] is set to be "+1" by the sign detector circuit 120. When the (n)th symbol of the received Pseudo-Noise Sequence PNR[i] is less than "0", the (n)th symbol of the received signal r[i] is set to be "−1" by the sign detector circuit 120. The implementations of the sign detector circuit 120 above are given for illustrative purposes only. Various implementations of the sign detector circuit 120 are within the contemplated scope of the present disclosure.

As illustrated in FIG. 2, the received signal r[i] converted by the sign detector circuit 120 also includes eight symbols. Based on the operations above, under a condition that the symbols of the received Pseudo-Noise Sequence PNR[i] are the same to the symbols of the Pseudo-Noise Sequence PN[i] (an ideal condition without being affected by inter-symbol interference (ISI) and a quality of the transition channel), a symbol r[0] is "+1", a symbol r[1] is "+1", a symbol r[2] is "+1", a symbol r[3] is "+1", a symbol r[4] is "−1", a symbol r[5] is "+1", a symbol r[6] is "+1", a symbol r[7] is "−1".

If a sign of a symbol of the Pseudo-Noise Sequence PN[i] is the same to a sign of an adjacent symbol, the symbol is one of the first calculation symbols. In some embodiments, the adjacent symbol may be a following symbol. For example, since the symbol PN[0] and the symbol PN[1] are "+1", the symbol PN[0] is selected to be one of the first calculation symbols. Similarly, since the symbol PN[1] and the symbol PN[2] are "+1", the symbol PN[1] is selected to be one of the first calculation symbols, and so on. Accordingly, the symbols PN[0], PN[1], PN[2], PN[5] are selected to be the first calculation symbols (shown by thick lines in FIG. 2). In some other embodiments, the adjacent symbol may be a previous symbol.

Accordingly, symbols, corresponding to the first calculation symbols, of the received signal r[i] are selected to be second calculation symbols. Accordingly, the second calculation symbols include the symbol r[0], the symbol [1], the symbol [2], and the symbol r[5] (shown by thick lines in FIG. 2).

Since there are four first calculation symbols, the storage circuit 140 are designed to include three delay circuits D[0]-D[2], four registers 142[0]-142[3], and four registers 144[0]-144[3].

In some embodiments, the delay circuits D[0]-D[2] have different delay times respectively. For the aforementioned embodiments, the delay time of the delay circuit D[0] is the same to the delay time of the delay circuit D[1], but is different from the delay time of the delay circuit D[2].

The registers 142[0]-142[3] are configured to store the first calculation symbols PN[0], PN[1], PN[2], and PN[5] respectively. The registers 144[0]-144[3] are configured to store the second calculation symbols r[0], r[1], r[2], and r[5] respectively.

As illustrated in FIG. 1, the calculator circuit 160 includes a multiplication circuit 162 and an addition circuit 164. The multiplication circuit 162 includes four multipliers. The addition circuit 164 includes three adders. The first multiplier multiplies the first calculation symbol PN[0] (value is "+1") and the second calculation symbol r[0] (value is "+1"), to generate a calculation value (value is "+1"). The second multiplier multiplies the first calculation symbol PN[1] (value is "+1") and the second calculation symbol r[1] (value is "+1"), to generate a calculation value (value is "+1"). The first adder sums up the calculation value from the first multiplier and the calculation value from the second multiplier, and so on. As a result, a calculation value Y (value is "4") is generated. Based on the operations above, when one of the symbols of the Pseudo-Noise Sequence PN[i] is correctly received, the calculation value Y increases. On the contrary, when one of the symbols of the Pseudo-Noise Sequence PN[i] is not correctly received, the calculation value Y decreases. For example, under a condition that the first calculation symbol is "+1", when the Pseudo-Noise Sequence PN[i] is not correctly received, the second calculation value may be "−1". Accordingly, a calculation value generated by a corresponding multiplier is "−1". This calculation value ("−1") makes the calculation value Y to be decreased. Accordingly, the calculation value Y can indicate accuracy of the received Pseudo-Noise Sequence PNR[i].

In some other embodiments, the sign detector circuit 120 may be implemented by a slicer. Under this condition, the multipliers in the multiplication circuit 162 are replaced by a plurality of XNOR gates respectively. In these embodiments, when an (n)th symbol of the received Pseudo-Noise Sequence PNR[i] is equal to or greater than "0", an (n)th symbol of the received signal r[i] is set to be "+1" by the sign detector circuit 120. When the (n)th symbol of the received Pseudo-Noise Sequence PNR[i] is less than "0", the (n)th symbol of the received signal r[i] is set to be "0" by the sign detector circuit 120. In these embodiments, the (n)th symbol of the Pseudo-Noise Sequence PN[i] is transmitted to one input terminal of one of the XNOR gates, and the (n)th symbol of the received signal r[i] is transmitted to another input terminal of the one of the XNOR gates. When the (n)th symbol of the Pseudo-Noise Sequence PN[i] is "+1", "+1" is transmitted to the one input terminal of the one of the XNOR gates. On the contrary, when the (n)th symbol of the Pseudo-Noise Sequence PN[i] is "−1", "0" is transmitted to the one input terminal of the one of the XNOR gates.

Accordingly, when both of the (n)th symbol of the Pseudo-Noise Sequence PN[i] and the (n)th symbol of the received signal r[i] are corresponding to "+1" or are corresponding to "−1", an output value of the one of the XNOR gates is "+1". When one of the (n)th symbol of the Pseudo-Noise Sequence PN[i] and the (n)th symbol of the received signal r[i] is corresponding to "+1" and another one is corresponding to "−1", the output value of the one of the XNOR gates is "0". Based on the operations above, when the one symbol of the Pseudo-Noise Sequence PN[i] is correctly received, the calculation value Y is increased. On the contrary, when the one symbol of the Pseudo-Noise Sequence PN[i] is not correctly received, the calculation value Y is maintained. Accordingly, the calculation value Y can indicate accuracy of the received Pseudo-Noise Sequence PNR[i].

Then, the comparator circuit 180 compares the calculation value Y with a threshold value TS, to generate a comparison result CR. In some embodiments, the comparator circuit 180 may be implemented by a comparator. A processor circuit (not shown) of the receiver device can determine whether the detector circuit 100 of the receiver device correctly receives the Pseudo-Noise Sequence PN[i] according to the comparison result CR. For example, when the comparison result CR indicates that the calculation value Y is equal to or less than the threshold value TS, the processor circuit determines that the detector circuit 100 does not correctly receive the Pseudo-Noise Sequence PN[i]. On the contrary, when the comparison result CR indicates that the calculation value Y is greater than the threshold value TS, the processor circuit determines that the detector circuit 100 correctly receives the Pseudo-Noise Sequence PN[i]. Under this condition, the synchronization procedure between the receiver device and the transmitter device is completed. Then, the transmitter device can transmit signals to the receiver device, and the receiver device also can transmit signals to transmitter device.

In some further embodiments, both of the transmitter device and the receiver device have the detector circuit 100. In operation, the transmitter device transmits the Pseudo-Noise Sequence PN[i] to the detector circuit 100 of the receiver device, and the detector circuit 100 of the receiver device could determine whether the receiver device correctly receive the Pseudo-Noise Sequence PN[i]. Similarly, the receiver device may transmit the Pseudo-Noise Sequence PN[i] to the detector circuit 100 of the transmitter device, the detector circuit 100 of the transmitter device could determine whether the receiver device correctly receive the Pseudo-Noise Sequence PN[i]. When both of the receiver device and the transmitter device correctly receive the Pseudo-Noise Sequence PN[i], the synchronization procedure between the receiver device and the transmitter device is completed.

The mechanism of selecting the first calculation symbols can be applied to more adjacent symbols. In some other embodiments, if signs of an (i)th symbol, an (i+1)th symbol, and an (i−1)th symbol of the Pseudo-Noise Sequence PN[i] are the same, the (i)th symbol is selected to be one of the first calculation symbols. In some other embodiments, if signs of the (i)th symbol, an (i+2)th symbol, the (i+1)th symbol, the (i−1)th symbol, and an (i−2)th symbol of the Pseudo-Noise Sequence PN[i] are the same, the (i)th symbol is selected to be one of the first calculation symbols.

In some related technology, the detector circuit calculates all symbols. However, if signs of two adjacent symbols of the Pseudo-Noise Sequence PN[i] are not the same (for example, one symbol is "+1", and another symbol is "−1"), two corresponding symbols of the received Pseudo-Noise Sequence PNR[i] are easier to be determined by mistake due to ISI, such that accuracy of the system is decreased. On the contrary, if signs of successive symbols of the Pseudo-Noise Sequence PN[i] are the same, corresponding symbols of the received Pseudo-Noise Sequence PNR[i] are not easier to be wrong. Accordingly, the detector circuit 100 selects a symbol from the successive symbols of the Pseudo-Noise Sequence PN[i] to be one of the first calculation symbols and calculates selected first calculation symbols and corresponding second calculation symbols. Since the number of the selected first calculation symbols (or the second calculation symbols) is less than the number of all symbols of the Pseudo-Noise Sequence PN[i], the number of the multipliers of the calculator circuit 160 and the number of the adders of the calculator circuit 160 can be decreased under a condition that accuracy of the system is maintained, such that circuit complexity and calculation complexity of the detector circuit 100 are decreased.

In addition, in some related technology, analog-to-digital converters with multi-symbols are adopt to convert the received Pseudo-Noise Sequence PNR[i]. Compared to these analog-to-digital converters, complexity of the sign detector circuit 120 is lower. Thus, complexity of the detector circuit 100 can be decreased.

In addition, in some related technology, the second calculation values are floating numbers. Compared to these related technology, the symbols of the received signal r[i] converted by the sign detector circuit 120 are "+1" or "−1". Thus, the second calculation symbols selected from this received signal r[i] are not floating numbers. In other words, the first calculation symbols and the second calculation symbols stored in the storage circuit 140 are not floating numbers. Thus, cost of the storage circuit 140 can be decreased, and calculation complexity and cost of the calculator circuit 160 can be decreased.

Figure 3:
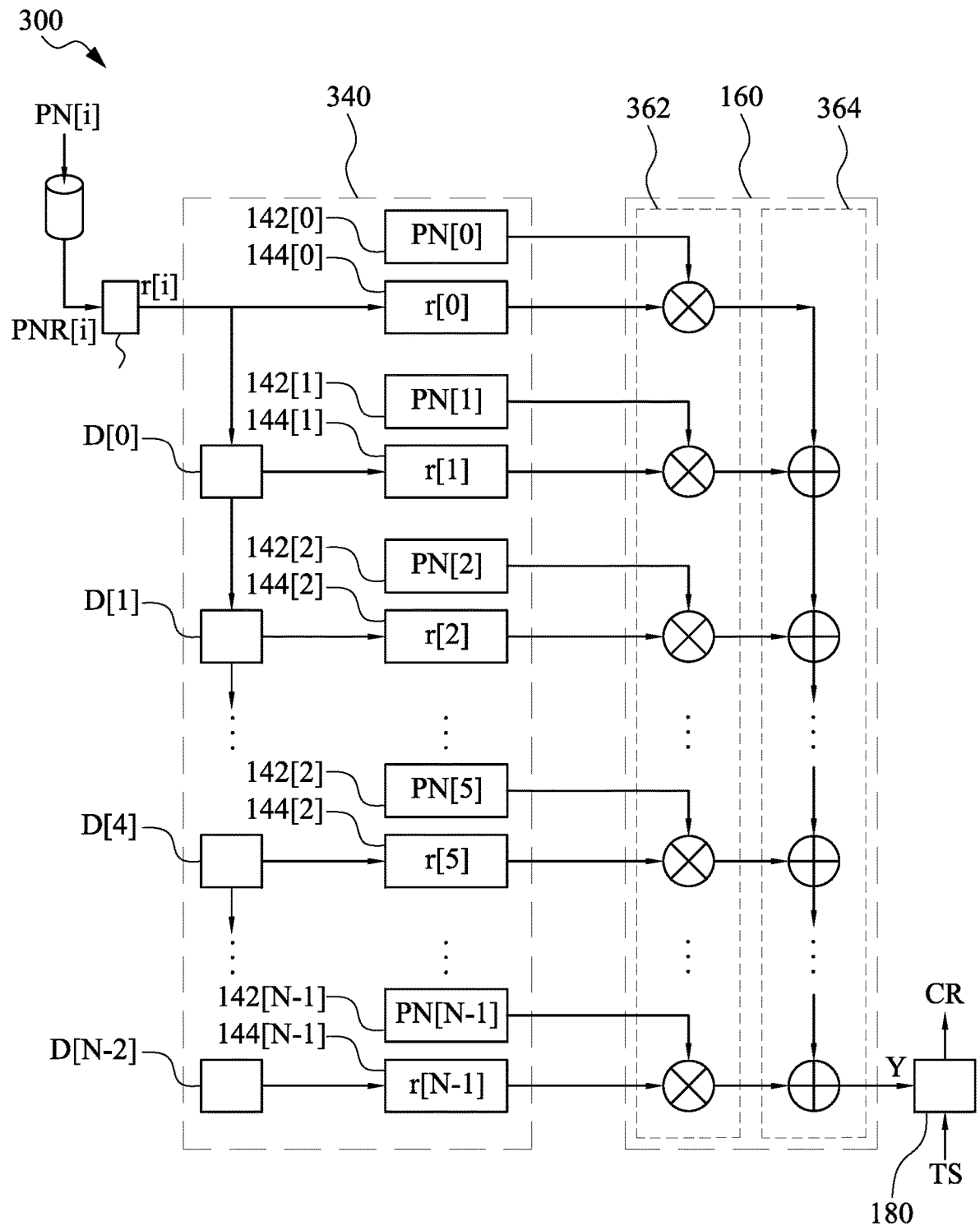
FIG. 3 is a circuit diagram illustrating a detector circuit according to some embodiments of the present disclosure.

Reference is made to FIG. 3. FIG. 3 is a circuit diagram illustrating a detector circuit 300 according to some embodiments of the present disclosure. For ease of understanding, with respect to the embodiments of FIG. 1, like elements in FIG. 3 are designated with the same reference numbers. Only differences between FIG. 3 and FIG. 1 are described in following paragraphs.

When the Pseudo-Noise Sequence PN[i] includes N symbols, a storage circuit 340 includes (N−1) delay circuits D[0]-D[N−2], N registers 142[0]-142[N−1], and N registers 144[0]-144[N−1], a multiplication circuit 362 includes N multipliers, and an addition circuit 364 includes (N−1) adders. Symbols of the Pseudo-Noise Sequence PN[i] are stored in the registers 142[0]-142[N−1] respectively. Symbols of the received signal r[i] are stored in the registers 144[0]-144[N−1] respectively. As described above, the symbols PN[0], PN[1], PN[2], PN[3], PN[5], PN[6] of the Pseudo-Noise Sequence PN[i] are "+1" and the symbols r[0], r[1], r[2], r[3], r[5], r[6] of the received signal r[i] are "+1". Other symbols of the Pseudo-Noise Sequence PN[i] are "−1" and other symbols of the received signal r[i] are "−1". Thus, calculation values of all multipliers are "+1". The addition circuit 364 sums up the calculation values of all multipliers, to generate the calculation value Y. Other contents about the detector circuit 300 are similar to those of the detector circuit 100 in FIG. 1, so they are not described herein again.

Figure 4:
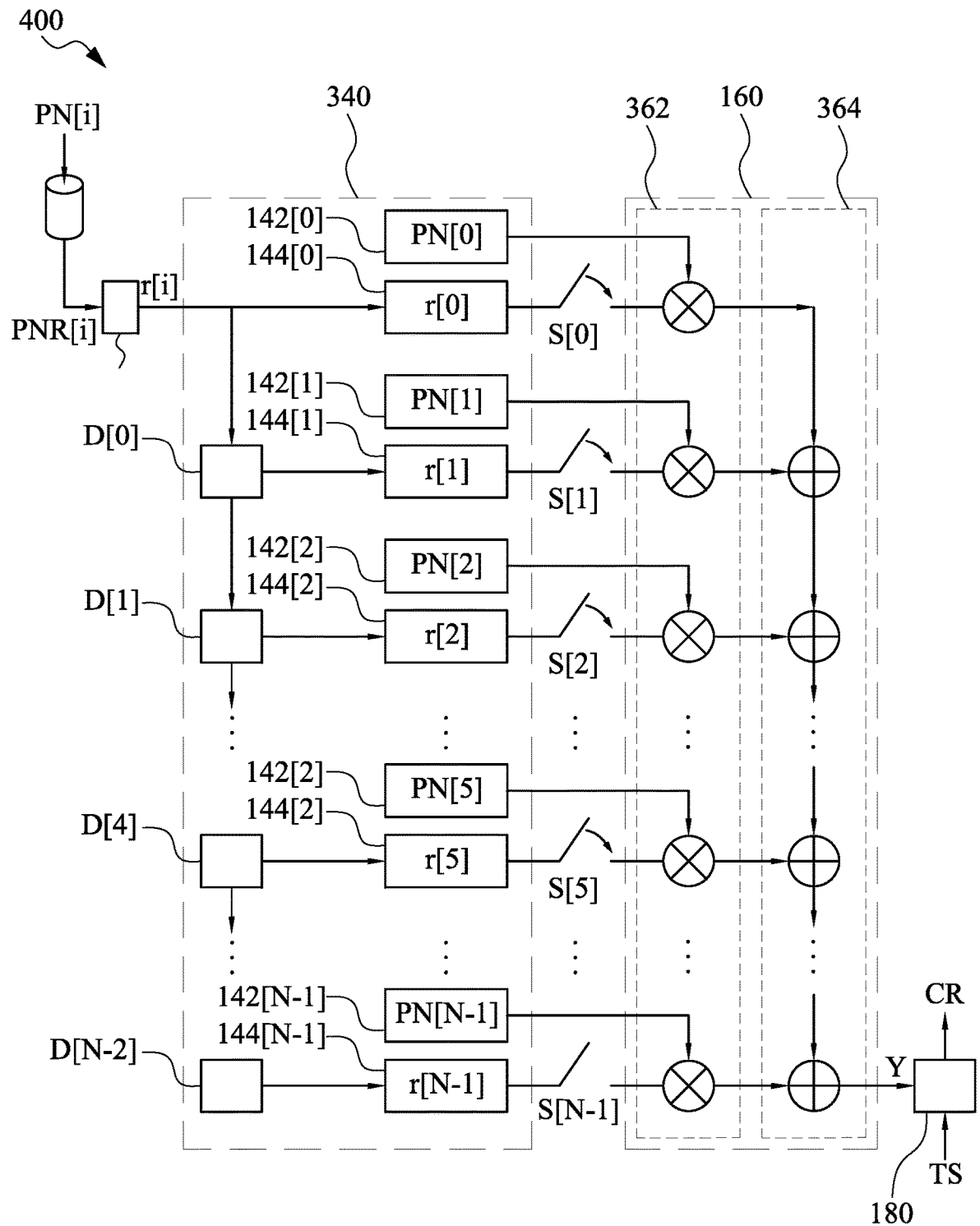
FIG. 4 is a circuit diagram illustrating a detector circuit according to some embodiments of the present disclosure.

As illustrated in FIG. 4. FIG. 4 is a circuit diagram illustrating a detector circuit 400 according to some embodiments of the present disclosure. For ease of understanding, with respect to the embodiments of FIG. 3, like elements in FIG. 4 are designated with the same reference numbers. Only differences between FIG. 4 and FIG. 3 are described in following paragraphs.

As illustrated in FIG. 4, the detector circuit 400 further includes N switches S[0]-S[N−1]. The switches S[0]-S[N−1] are coupled to the multipliers respectively. As described above, since the symbols PN[0], PN[1], PN[2], PN[5] of the Pseudo-Noise Sequence PN[i] are selected as the first calculation symbols, the switches S[0], S[1], [2], S[5] are controlled to be turned on and other switches are controlled to be turned off. Thus, only the first calculation symbols PN[0], PN[1], PN[2], and PN[5] and the second calculation symbols r[0], r[1], r[2], and r[5] are calculated by the calculator circuit 160 to generate the calculation value Y. Effectively, it is not that all symbols are calculated by the calculator circuit 160. Other contents about the detector circuit 400 are similar to those of the detector circuit 300 in FIG. 3, so they are not described herein again.

Figure 5:
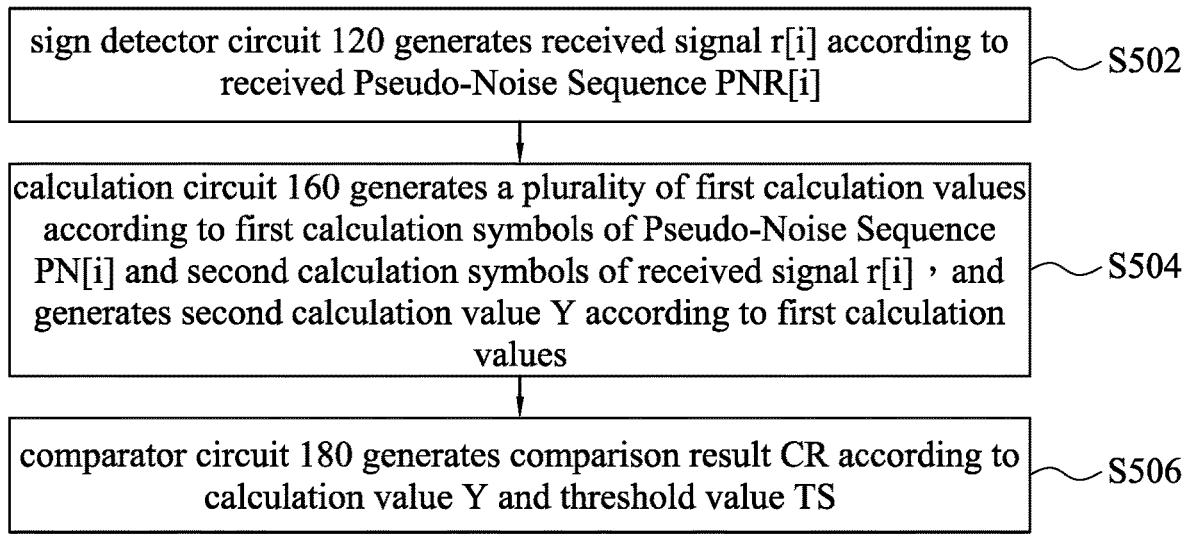
FIG. 5 is a flow diagram illustrating an operation method of a detector circuit according to some embodiments of the present disclosure.

Reference is made to FIG. 5. FIG. 5 is a flow diagram illustrating an operation method 500 of a detector circuit according to some embodiments of the present disclosure. The operation method 500 includes operations S502, S504, and S506. In some embodiments, the operation method 500 is applied to the detector circuit 100 in FIG. 1, but the present disclosure is not limited thereto. For better understanding of the present disclosure, the operation method 500 is discussed with reference to FIG. 1.

In operation S502, the sign detector circuit 120 generates the received signal r[i] according to the received Pseudo-Noise Sequence PNR[i], and the received Pseudo-Noise Sequence PNR[i] corresponds to the Pseudo-Noise Sequence PN[i]. In some embodiments, the Pseudo-Noise Sequence PN[i] from the transmitter is transmitted through the transmission channel to generate the received Pseudo-Noise Sequence PNR[i], and the received Pseudo-Noise Sequence PNR[i] is received by the sign detector circuit 120 of the detector circuit 100. When the (n)th symbol of the received Pseudo-Noise Sequence PNR[i] is equal to or greater than "0", the (n)th symbol of the received signal r[i] is set to be "+1" by the sign detector circuit 120. When the (n)th symbol of the received Pseudo-Noise Sequence r[i] is less than "0", the (n)th symbol of the received signal is set to be "−1" or "0" by the sign detector circuit 120.

In operation S504, the calculator circuit 160 generates the first calculation values according to the first calculation symbols of the Pseudo-Noise Sequence PN[i] and the second calculation symbols of the received signal r[i], and generates the second calculation value Y according to the first calculation values. In some embodiments, if a sign of a symbol of the Pseudo-Noise Sequence PN[i] is the same to a sign of an adjacent symbol, the symbol is selected to be one of the first calculation symbols. A corresponding symbol of the received signal r[i] is selected to be one of the second calculation symbols. In some embodiments, the multiplication circuits 162 of the calculator circuit 160 multiplies one of the first calculation symbols and a corresponding symbol of the second calculation symbols respectively, to generate the first calculation values. The addition circuit 164 of the calculator circuit 160 sums up the first calculation values to generate the calculation value Y.

In operation S506, the comparator circuit 180 generates the comparison result CR according to the calculation value Y and the threshold value TS. In some embodiments, when the comparison result CR indicates that the calculation value Y is greater than the threshold value TS, the processor circuit of the receiver device determines that the detector circuit 100 correctly receives the Pseudo-Noise Sequence PN[i]. On the contrary, when the comparison result CR indicates that the calculation value Y is equal to or less than the threshold value TS, the processor circuit determines that the detector circuit 100 does not correctly receive the Pseudo-Noise Sequence PN[i].

As shown in the above embodiments, the detector circuit of the present disclosure can decrease circuit complexity and calculation complexity.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A detector circuit comprising:
   a calculator circuit configured to generate a plurality of first calculation values according to a plurality of first calculation symbols of a Pseudo-Noise Sequence and a plurality of second calculation symbols of a received signal, and generate a second calculation value according to the first calculation values, wherein if a sign of a symbol of the Pseudo-Noise Sequence is the same to a sign of an adjacent symbol, the symbol is one of the first calculation symbols, wherein the second calculation symbols are corresponding to the first calculation symbols respectively; and
   a comparator circuit configured to generate a comparison result according to the second calculation value and a threshold value, wherein the comparison result is configured for determining whether the detector circuit correctly receives the Pseudo-Noise Sequence.

2. The detector circuit of claim 1, wherein the calculator circuit comprises a multiplication circuit and the multiplication circuit comprises:
   a plurality of multipliers configured to multiply one of the first calculation symbols with a corresponding one of the second calculation symbols respectively, to generate the first calculation values, wherein the Pseudo-Noise Sequence comprises N symbols, and the number of multipliers is less than N.

3. The detector circuit of claim 2, wherein the calculator circuit further comprises an addition circuit and the addition circuit comprises:
   a plurality of adders configured to sum up the first calculation values to generate the second calculation value.

4. The detector circuit of claim 1, wherein the calculator circuit comprises a multiplication circuit and the multiplication circuit comprises:
   a plurality of multipliers coupled to a plurality of switches respectively, wherein the switches comprises first switches, and the first switches are corresponding to the first calculation symbols and are turned on, in order to generate the first calculation values.

5. The detector circuit of claim 1, wherein when the comparison result indicates that the second calculation value is greater than the threshold value, it is determined that the detector circuit correctly receives the Pseudo-Noise Sequence, wherein when the comparison result indicates that the second calculation value is equal to or less than the threshold value, it is determined that the detector circuit does not correctly receive the Pseudo-Noise Sequence.

6. The detector circuit of claim 1 further comprising:
a storage circuit comprises:
a plurality of first registers configured to store the first calculation symbols respectively; and
a plurality of second registers configured to store the second calculation symbols respectively.

7. The detector circuit of claim 1, wherein the Pseudo-Noise Sequence is transmitted from a transmitter device to a receiver device, and the receiver device comprises the detector circuit.

8. A detector circuit comprising:
a sign detector circuit configured to generate a received signal according to a received Pseudo-Noise Sequence corresponding to a Pseudo-Noise Sequence;
a calculator circuit configured to generate a plurality of first calculation values according to a plurality of first calculation symbols of the Pseudo-Noise Sequence and a plurality of second calculation symbols of the received signal, and generate a second calculation value according to the first calculation values, wherein the second calculation symbols are corresponding to the first calculation symbols respectively; and
a comparator circuit configured to generate a comparison result according to the second calculation value and a threshold value, wherein the comparison result is configured for determining whether the detector circuit correctly receives the Pseudo-Noise Sequence.

9. The detector circuit of claim 8, wherein when an (n)th symbol of the received Pseudo-Noise Sequence is equal to or greater than 0, an (n)th symbol of the received signal is +1.

10. The detector circuit of claim 8, wherein when an (n)th symbol of the received Pseudo-Noise Sequence is less than 0, an (n)th symbol of the received signal is −1 or 0.

11. The detector circuit of claim 8, wherein the calculator circuit comprises a multiplication circuit and the multiplication circuit comprises:
a plurality of multipliers configured to multiply one of the first calculation symbols with a corresponding one of the second calculation symbols respectively, to generate the first calculation values, wherein the Pseudo-Noise Sequence comprises N symbols, and the number of multipliers is less than N.

12. The detector circuit of claim 11, wherein the calculator circuit further comprises an addition circuit and the addition circuit comprises:
a plurality of adders configured to sum up the first calculation values to generate the second calculation value.

13. The detector circuit of claim 8, wherein the calculator circuit comprises a multiplication circuit and the multiplication circuit comprises:

a plurality of multipliers coupled to a plurality of switches respectively, wherein the switches comprises first switches, and the first switches are corresponding to the first calculation symbols and are turned on, in order to generate the first calculation values.

14. The detector circuit of claim 8 further comprising:
a storage circuit comprises:
a plurality of first registers configured to store the first calculation symbols respectively; and
a plurality of second registers configured to store the second calculation symbols respectively.

15. The detector circuit of claim 8, wherein the Pseudo-Noise Sequence is transmitted from a transmitter device to a receiver device, and the receiver device comprises the detector circuit.

16. An operation method of a detector circuit comprising:
generating, by a sign detector circuit, a received signal according to a received Pseudo-Noise Sequence corresponding to a Pseudo-Noise Sequence;
generating, by a calculator circuit, a plurality of first calculation values according to a plurality of first calculation symbols of the Pseudo-Noise Sequence and a plurality of second calculation symbols of the received signal, and generating a second calculation value according to the first calculation values, wherein if a sign of a symbol of the Pseudo-Noise Sequence is the same to a sign of an adjacent symbol, the symbol is one of the first calculation symbols, wherein the second calculation symbols are corresponding to the first calculation symbols respectively; and
generating, by a comparator circuit, a comparison result according to the second calculation value and a threshold value, wherein the comparison result is configured for determining whether the detector circuit correctly receives the Pseudo-Noise Sequence.

17. The operation method of claim 16, wherein generating the received signal according to the received Pseudo-Noise Sequence by the sign detector circuit comprises:
generating, by the sign detector circuit, an (n)th symbol being +1 of the received signal when an (n)th symbol of the received Pseudo-Noise Sequence is equal to or greater than 0.

18. The operation method of claim 16, wherein generating the received signal according to the received Pseudo-Noise Sequence by the sign detector circuit comprises:
generating, by the sign detector circuit, an (n)th symbol being −1 or 0 of the received signal when an (n)th symbol of the received Pseudo-Noise Sequence is less than 0.

19. The operation method of claim 16, wherein when the comparison result indicates that the second calculation value is greater than the threshold value, it is determined that the detector circuit correctly receives the Pseudo-Noise Sequence.

20. The operation method of claim 19, wherein when the comparison result indicates that the second calculation value is equal to or less than the threshold value, it is determined that the detector circuit does not correctly receive the Pseudo-Noise Sequence.

* * * * *